(12) United States Patent
Schneider et al.

(10) Patent No.: US 7,092,425 B1
(45) Date of Patent: Aug. 15, 2006

(54) VCSEL DEVICE WITH IMPROVED MODAL PROPERTIES

(75) Inventors: Richard P. Schneider, Mountain View, CA (US); Frank H. Peters, San Jose, CA (US); An-Nien Cheng, San Jose, CA (US); Laura Giovane, San Francisco, CA (US); Hao-chung Kuo, San Jose, CA (US); Sheila K. Mathis, Sunnyvale, CA (US)

(73) Assignee: Avago Technologies General IP (Singapore) Ptd. Ltd. (SG)

( * ) Notice: Subject to any disclaimer, the term of this patent is extended or adjusted under 35 U.S.C. 154(b) by 136 days.

(21) Appl. No.: 09/680,726

(22) Filed: Oct. 5, 2000

(51) Int. Cl.
*H01S 5/183* (2006.01)

(52) U.S. Cl. .................... 372/50.124; 372/18; 372/19; 372/43; 372/66; 372/103; 372/50.11

(58) Field of Classification Search .................. 372/45, 372/46, 96, 43.01, 50.11, 50.124; 438/31, 438/39, 47

See application file for complete search history.

(56) References Cited

U.S. PATENT DOCUMENTS

| | | | | |
|---|---|---|---|---|
| 5,774,487 A | * | 6/1998 | Morgan | 372/45 |
| 5,848,086 A | * | 12/1998 | Lebby et al. | 372/46 |
| 5,859,864 A | * | 1/1999 | Jewell | 372/45 |
| 6,728,289 B1 | * | 4/2004 | Peake et al. | 372/101 |

* cited by examiner

*Primary Examiner*—Kenneth Parker
*Assistant Examiner*—José R. Diaz (57) ABSTRACT

Using lateral physical modulation, the optical properties of VCSELs can be stabilized and controlled by spatially varying the characteristics of the device material. This results in stabilization of the linewidth, the numerical aperture, the near and far field, as a function of bias and temperature. A VCSEL includes a substrate, an active region sandwiched between an upper and lower distributed Bragg reflector (DBRs), and electrical contacts. A light emission property e.g. the index of refraction, may be varied by patterning or texturing the surface of the substrate prior to growth of the epitaxial DBR layers or at least one layer of either the upper or lower DBRs, or by inserting a non-planar layer.

30 Claims, 6 Drawing Sheets

Growth surface prior to growth of the lower DBR

Figure 1A

Growth surface after the growth of 20 DBR pair layers

Figure 1B

Growth surface during growth of the active region

Figure 1C

Figure 2A (PRIOR ART) NxN modal pattern

Figure 2B spatially fixed modal pattern

Low state ⟶ High state

VCSEL DEVICE WITH IMPROVED MODAL PROPERTIES

FIELD OF THE INVENTION

The invention is directed towards the field of lasers, particularly towards stabilizing the optical modes of a vertical cavity surface emitting laser and reducing noise while maintaining narrow spectral linewidths.

BACKGROUND

Vertical cavity surface emitting lasers (VCSELs) have proven to be high performance optical sources for low cost, fiber optic communication systems. VCSELs can be made in one of four ways: etched post, implanted, oxide-confined, and planar-buried. These four families are distinguished by the nature of the electrical confinement that is used. At this time, only the implanted and oxide-confined VCSELs have been proven to be technologically and economically viable.

Implanted VCSELs suffer from a poorly defined current aperture and in most implementations, they lack an index guided optical aperture. The current guide is poorly defined due to the statistically diffuse nature of the implantation, which results in a gradual change from conductive to insulating material. Thus, high efficiency devices with apertures smaller than ~5 microns have not been demonstrated. In contrast, efficient oxide-confined VCSELs have been demonstrated with apertures less than ~2 microns. This improvement is possible because the native oxide used to confine the current can be precisely placed both laterally and vertically. In addition, the oxide layer also provides optical confinement of the lasing mode arising from the large index contrast between the oxide layer and the surrounding semiconductor.

All VCSELs operate in one or more optical modes. When an index guide exists, the lateral optical mode of the structure can be well described using standard electromagnetic models. Thus for oxide-confined devices, the modal properties of the devices can be predicted. The modes are well-defined even at current densities just above threshold due to the large index contrast provided by the oxide aperture.

In comparison, the implanted VCSELs lack an inherent optical index guide. Once current flows through the implanted VCSEL, a thermally induced index profile forms, due to a temperature profile created by current flowing through the device, since the structure has a non-zero resistance. Before the formation of the thermal index guide, the device may lase in a poorly defined, unstable manner characterized by one or more lasing "spots", localized regions substantially smaller than the implant (or oxide) aperture with intense light emission. This type of lasing is believed to be initiated by random, localized depressions in the carrier density, which result in small optical index steps. Because of the localized index step, lasing in this region is initiated, which stabilizes this fluctuation. This step contributes to the retention of the depletion of the carrier density in the lasing region. The formation of these lasing spots is a random process and is inherently unstable. Therefore, the spots may move or hop around spatially within the device aperture. In practice, these spots also manifest themselves as kinks in the light-output (L) versus current (I) characteristics. Kinks are discontinuities in the slope of the LI curve.

VCSELs operate in low divergence angle optical modes that can be easily coupled into optical fiber used in fiber optic data communications. In the ideal case, a high performance VCSEL device will couple consistently into the optical fiber and the coupling efficiency will not be a function of bias, and furthermore a high performance device will also have a modal structure that will lend itself to low noise operation.

At different bias currents, VCSELs possess different optical modal properties that are evident from the spectral output of the devices, as well as both the near and far field profiles. During high frequency modulation, the modal properties of the devices may change as a function of time as a result of a transient change in bias current, e.g. a switch from a high to low state. If the fiber coupling efficiency of the different modes is not identical, these modal changes will manifest themselves as variations with respect to time in the optical eye diagram. If the coupling is initially poor, and then improves with time, the device will appear to have a very slow rise time, which will lead to eye closure. Alternatively, if the coupling is initially good and then degrades with time, it will manifest itself as excessive overshoot in the eye diagram. During the turn-off of the eye equivalent problems can result. Typically, this coupling efficiency variation is reduced when a VCSEL operates in a large number of modes. Since none of the modes are dominant, the variations between modes are minimized. Unfortunately, in optical communication applications, lasers are modulated between two states: high ("1") and low ("0"). The bias current corresponding to the low state, is just above threshold where VCSELs typically operate in lower order modes. This results in non-ideal optical properties. During transitions between the low and high state, the VCSEL may change between operating in a few low order modes to operating in many high order modes, and as a result coupling (efficiency) variations can result.

A useful VCSEL should also operate with low noise. Here noise refers to the appearance of random intensity fluctuations as measured by the receiver in an optical fiber data link. One important source of noise is due to the beating of a few modes on the surface of the photodiode after passing through the optical fiber. When many modes are present, this type of noise is minimized, but when only two or three modes are present this type of noise is more significant. Additionally, for this beat noise to be significant there needs to be some sort of variation to cause the beating. One source of variation arises from the spatial instability of the intensely lasing spots exhibited by implanted VCSELs operating at currents just above threshold.

Near threshold at the low state, implanted VCSELs typically operate in no more than three modes and may operate in unstable lasing spots. At the high bias level, the devices will operate in many higher order modes. These characteristics are not optimal and result in coupling efficiency variations and beat noise that degrade the optical eye diagrams.

Oxide-confined VCSELs experience similar behavior with the exception that they are less susceptible to unstable spot formation because of the well-defined optical index guide provided by the oxide aperture.

Because the optical properties of the VCSELs are effected by changes in bias, operating temperature, and the alignment between the gain and the Fabry-Perot, e.g. lasing mode, it is extremely difficult to force the device to exhibit the desired optical modal properties over the entire operating range including temperature and bias.

U.S. Pat. No. 5,774,487, issued on Jun. 30, 1998, entitled "Filamented Multi-Wavelength Vertical Cavity Surface Emitting Laser", Morgan, et al. reduced the noise by creating an array of very small lasers within an aperture, e.g.

lasing in filaments. Filamented light output is defined to be one that differs from multi-mode light output in that each element operates like a separate laser substantially independent from the other filaments. These filaments are fixed spatially and result in many incoherent independent lasing sources. When operating in filaments, each isolated section of the laser will lase independently of every other portion of the laser. Since the filaments are small, they will lase primarily in the fundamental mode. Thus, even though many filaments are lasing and there are many spectral lines, the far field pattern is essentially Gaussian. This structure has a highly stable modal pattern made up of many independent or incoherent single mode spatially fixed filaments. Thus, the coupling into the optical fiber is consistent with respect to bias and temperature, resulting in very small coupling variations and low beat noise.

In spite of the low noise operation, these devices are not optimum for fiber optic links due to their excessive linewidth arising from the lack of coupling between independent spatially fixed filaments. If the linewidth is too large, then the bandwidth distance product of the link is compromised due to chromatic dispersion. Standards, e.g. Gigabit Ethernet and Fibre Channel, both define linewidth and specify maximum allowable linewidths to ensure that the signal can be read over the required distances of fiber. The linewidths of the VCSELs described by Morgan, et al. are too broad for current and proposed high performance standards needed at frequencies greater than 1 Gb/s. Even narrower linewidths may be required for higher speed or longer links applications making the techniques taught by Morgan, et al. inappropriate.

SUMMARY

The invention is a vertical cavity surface emitting laser (VCSEL) which uses a variation of the light emission properties across the light emitting aperture of the device to select spatially fixed higher order optical modes for lasing. A lateral modulation of the electrical and/or optical material properties defines discreet physical areas which confine areas of lasing to fixed regions within the aperture as the drive current is varied over a typical operating range for a VCSEL in an optical data link. Only a limited set of higher order optical modes will have lobes that correspond to areas that encourage lasing. These higher order optical modes are sufficiently close enough in frequency to promote substantially coherent laser emission as defined by producing emission with a root mean square (RMS) line width less than the upper specification for FibreChannel and GigaBit Ethernet of 0.85 nm. Furthermore, a VCSEL incorporating this invention operating near the threshold for the low, "0" state, operates in higher modes than a typical prior art VCSEL. By spatially constraining the lasing modes and only permitting higher order modes to be present during operation at the low state, this invention reduces noise and coupling efficiency variation. Thus the VCSEL that incorporates this invention derives improved performance in a fiber optic link. Because the VCSEL operates in higher order modes and does not create localized independent filaments, the VCSEL operates with a line width sufficiently narrow to meet the requirements of optical link standards.

The present invention constrains the electromagnetic modes of a VCSEL by spatially varying the characteristics of the device material. The VCSEL typically includes an active region sandwiched between an upper and lower distributed Bragg reflectors (DBRs). Each DBR is a mirror stack containing paired alternating layers of high and low refractive index material. Contacts are used to apply voltage across the active region. In one embodiment, the lateral variation of the index of refraction manifests itself as texture on the growth surface before the growth of the first layer of the lower DBR, as the VCSEL layers are subsequently grown the texture evolves as it is replicated. The non-planarity of the DBRs and active region allow a light emission property such as refractive index and Fabry-Perot wavelengths to vary within the aperture and hence the VCSEL lases in spatially fixed modes. In another embodiment, the substrate is patterned to achieve the textured layers.

BRIEF DESCRIPTION OF THE DRAWINGS

FIG. 2A illustrates the light intensity of the prior art VCSEL. FIG. 2B illustrates the light intensity of the present invention.

DETAILED DESCRIPTION OF PREFERRED EMBODIMENTS

In the preferred embodiment of the invention, the lateral variation of the index of refraction manifests itself as texture on the growth surface and the textured surface is replicated and evolves as layers are subsequently grown. A vertical cavity surface-emitting laser (VCSEL) device structure includes an active region sandwiched between an upper and lower DBR. Each DBR is a mirror stack containing paired layers of high and low refractive index material. Contacts are included so that voltage may be applied across the active region. A non-planar layer is introduced during fabrication of the device structure to allow a light emission property which varies within the aperture and generates light output that is in spatially fixed modes. To illustrate, a non-planar layer grown on top of the substrate exhibits a texture characterized by an undulated roughness prior to the growth of the first layer of the lower distributed Bragg reflector (DBR). This undulated roughness propagates into the subsequent layers to allow the light emission property to vary. The Fabry-Perot wavelength or the refractive index of the device structure are just two examples of the light emission property. Either one of the device layers may be non-planar or a non-planar layer may be used in the device structure. The roughness may be a regular pattern applied through lithographic techniques or alternatively, as texturizing via etching, abrasion, or other techniques known to those in the art.

In another embodiment, an optional planarizing layer may be introduced after the non-planar layer but prior to device completion. When the light emission property is the refractive index, the refractive index will vary between the non-planar layer and the planarizing layer.

Figure 1A:
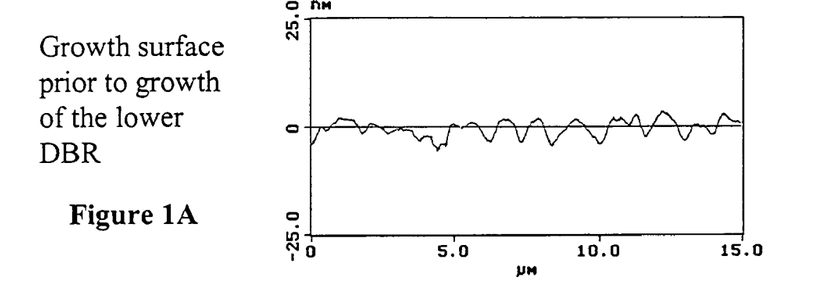
FIGS. 1A–C contains line scans representing the topology of the growth surface at three intervals during the epitaxial growth of the preferred vertical cavity surface emitting laser (VCSEL) structure.
Figure 1B:
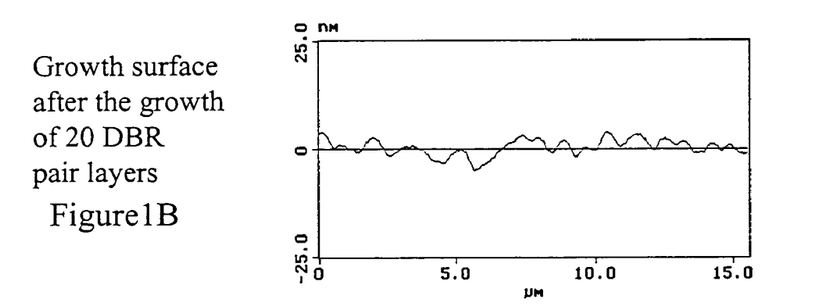
Figure 1C:
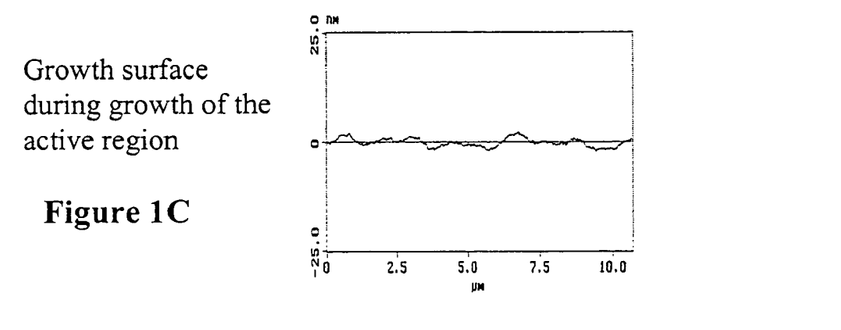

FIGS. 1A–C contains line scans representing the topology of the growth surface at three intervals during the epitaxial growth of the preferred vertical cavity surface emitting laser (VCSEL) structure, as measured by an atomic force microscope. These scans show typical preferred amplitudes and length scales for the undulated roughness. FIG. 1A shows the texture of the growth surface prior to the growth of the first layer of the bottom DBR. FIG. 1B shows the texture of the growth surface after twenty DBR pairs of the lower DBR have been grown. FIG. 1C shows the texture of the growth surface during the growth of the active layer. The evolution of the roughness includes an increase in the length scale of the roughness, d, (the average period of the undulation) and a reduction in the amplitude of the undulation, A. The preferred range of the length scale of the undulated roughness scales with the operating wavelength 8 of the device such that the 8/n<d<108 where n is the index (or effective index) of the material in which the lasing light is propagating. In the preferred embodiment, the amplitude (magnitude of the undulation) is sufficient to create a spatial variation in the Fabry-Perot wavelength within the aperture on the order of 1 nm (but may be substantially more or less).

The texturing in the plane of the wafer creates lateral variation of the light emission properties across the aperture of the VCSEL. Texturing results in a non-planar interface morphology. This variation in light emission properties spatially enables certain higher order optical modes, whose lobes of high optical intensity correspond to the spatial texturing. Only a select number of the higher order modes will have sufficient overlap with the spatial texturing, and as a result the VCSEL of the current invention emission will consist of several of these select higher order modes which are fixed spatially and stable with respect to drive current. The spatial definition provided by the texture prevents mode hopping and thus as the VCSEL transitions between the high and low states the deleterious effects of the variation in coupling efficiency and noise effects can be reduced.

Figure 2A:
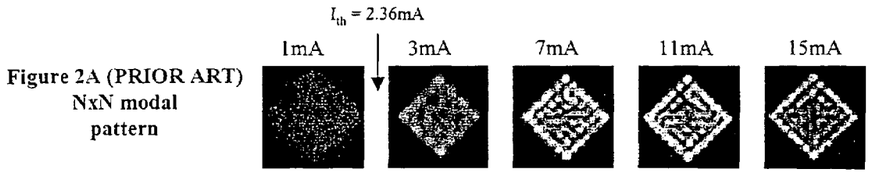
FIGS. 2A–B compare the light intensity between a prior art VCSEL and one of the present invention.
Figure 2B:
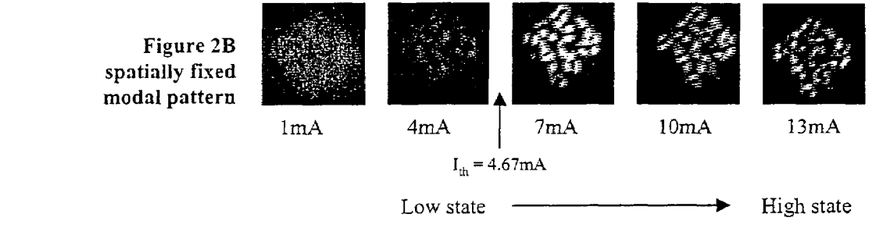

FIGS. 2A–B compare the light intensity between a prior art VCSEL and one of the present invention. FIG. 2A shows the prior art VCSEL with square aperture. As the drive current increases, the device exhibits increasingly higher order modes. An increase in the number of localized lasing spots of intense light emission and a decrease in spacing between these lasing spots mark the transition to higher order modes. FIG. 2B shows the near field light emission pattern of a VCSEL of the current invention with spatially fixed modes as the drive current increases. As drive current increases the lasing spots are predominately spatially fixed. The pattern of localized intense light output is constant across a wide range of currents that include those just above threshold (for low state operation) and those at higher currents (necessary for high state operation). The spatially fixed modal patterns prevent spatial mode hopping, reducing signal-to-noise and discontinuities in the light output as a VCSEL is switched from high to low state. This behavior reduces the coupling variations created during the transitions, and also reduces beat noise. Alternately for a given noise figure, the device can be operated at lower bias currents which is preferred for reliability and system restrictions in optical links.

When the prior art VCSEL is driven at higher drive currents, as shown in FIG. 2A, the light intensity tends to come increasingly from the perimeter of the device. In FIG. 2B, showing the VCSEL of current invention with spatially fixed modal pattern the distribution of light is not shifting to the perimeter of the device as drive current is increased. In the present invention, degradation that results from the combination of high photon and high current densities at the perimeter of the aperture and the point defect sources associated with the oxide aperture or implant aperture may be reduced because the optical power is more evenly distributed across the aperture during device operation.

Figure 3:
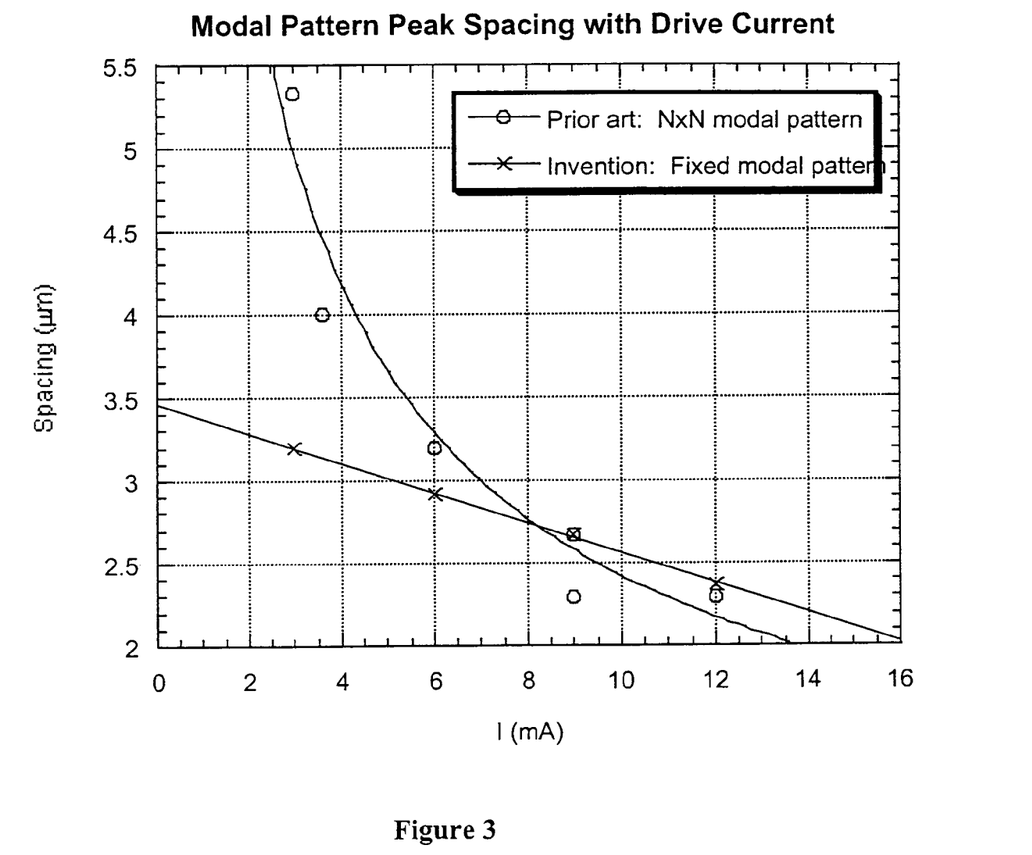
FIG. 3 shows the spacing between localized spots of intense light emission as a function of drive current.

The variation in light emission properties across the aperture of the VCSEL, which serves to define the fixed regions of the spatial emission pattern, also insure that the VCSEL operates in higher order modes than the prior art VCSEL. FIG. 3 shows the spacing between localized spots of intense light emission as a function of drive current. The decreasing spacing between these spots with increasing drive current indicates the transition to higher order modes. At currents corresponding to operation at the low state (just above threshold), the prior art VCSEL shows operation with spots at larger spacings than does the VCSEL of this invention thus indicating operation at higher order modes for the low state bias point.

Figure 4:
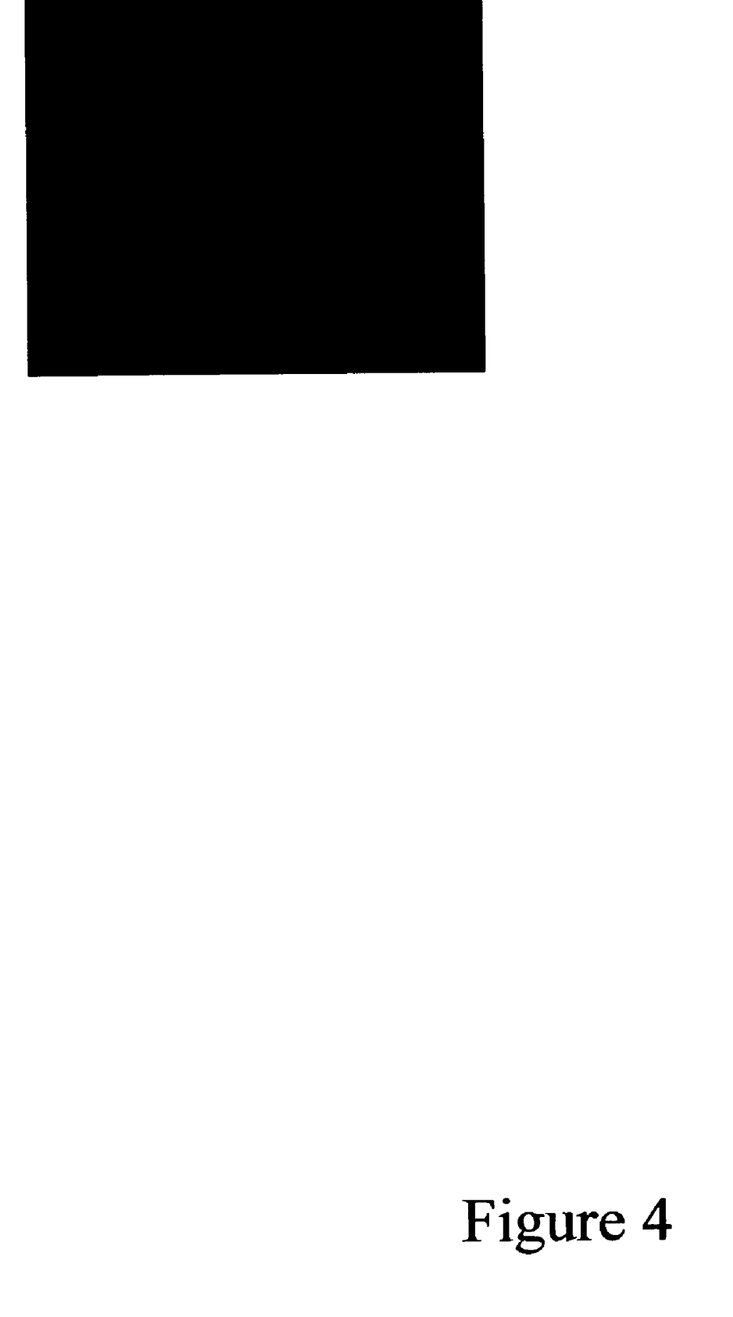
FIG. 4 shows the far-field image of a VCSEL of the current invention.

VCSELs made according to this invention operate with higher order modes. This means that the spots that are seen in the near field are purely multiple lobes of higher order electromagnetic lasing modes. FIG. 4 shows the far-field image of a VCSEL of the current invention. The far-field pattern clearly shows an annulus, characteristic of higher order modes. The aforementioned patent of Morgan et al. teaches a Gaussian far-field distribution for the filamented VCSEL device described therein. This corresponds to the device operating with multiple independent filaments which are incoherent with respect to one another; such a characteristic is contrasted to the lasing characteristics of the VCSEL described in the present invention.

Figure 5A:
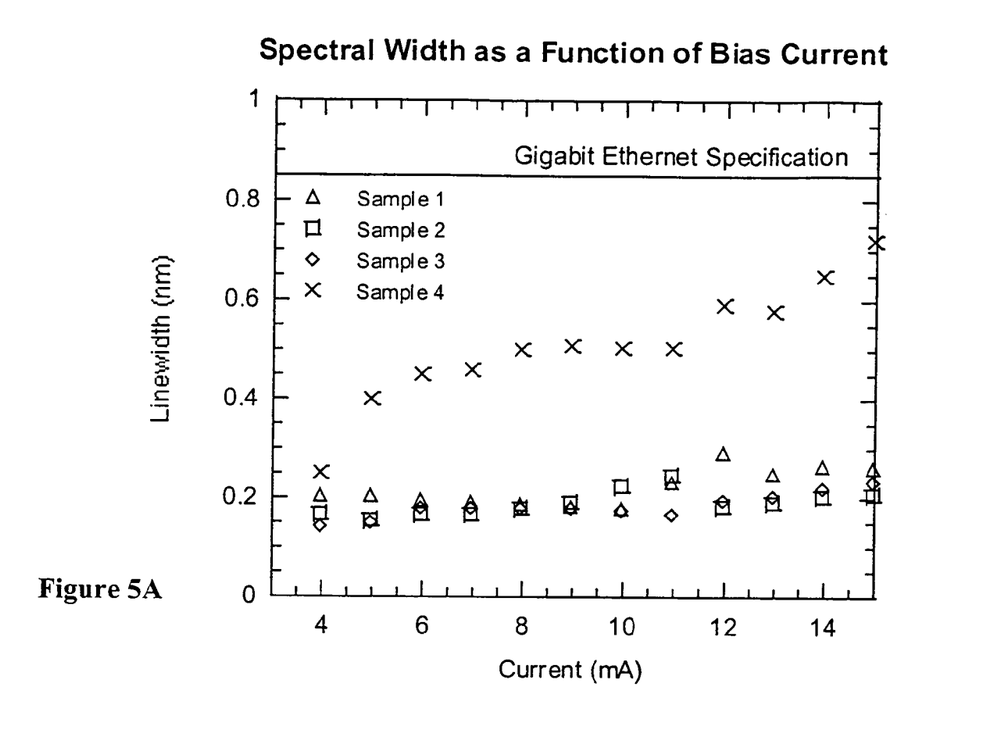
FIGS. 5A–B illustrate the line widths of the emission spectra for the present invention.
Figure 5B:
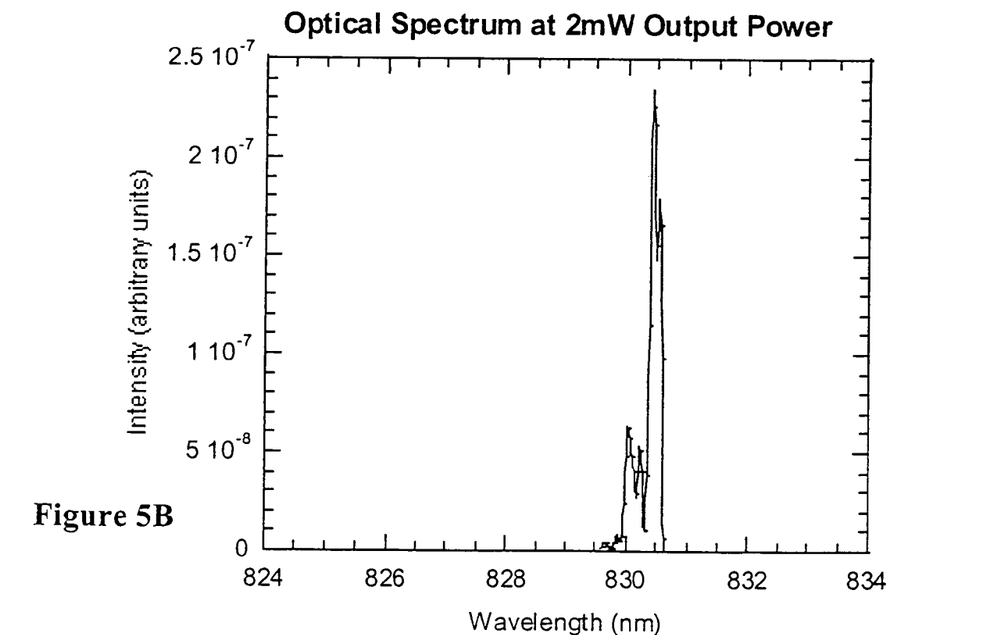

Because the lasing spots exhibited by the current invention make up higher order multi-lobed optical modes, the line widths of the emission spectra are narrow as seen in FIGS. 5A–B. FIG. 5A shows the RMS line width as function of drive current for a VCSEL with spatially fixed modal pattern. The line width is substantially independent of drive current. Furthermore the line widths at even the highest currents necessary for high state operation (~9 mA) are well below the Gigabit Ethernet standard of RMS linewidth being less than 0.85 nm. This clearly establishes that light emission from VCSELs of this current invention is acceptable for the requirements of optical links. FIG. 5B shows the optical spectrum of a VCSEL operating at a typical high state. The relatively narrow line width indicates that the modes in the VCSEL are substantially coherent. The spectrum shows a narrow emission spectrum <1 nm even at bias currents corresponding to the high state. Morgan, et al. present much wider emission spectra with line widths greater than 5 nm and a higher drive currents exceeding 10 nm, which result from the fact that the filaments are operating substantially independently and consequently each at a different wavelength and phase. In column 6, lines 54–56 of U.S. Pat. No. 5,774,487, Morgan, et al. teach that this optical spectrum is wide enough (5 nm) for incoherence. The current invention provides light output that is substantially coherent, manifested in the narrow line widths and required by high speed fiber optic standards.

Figure 6A:
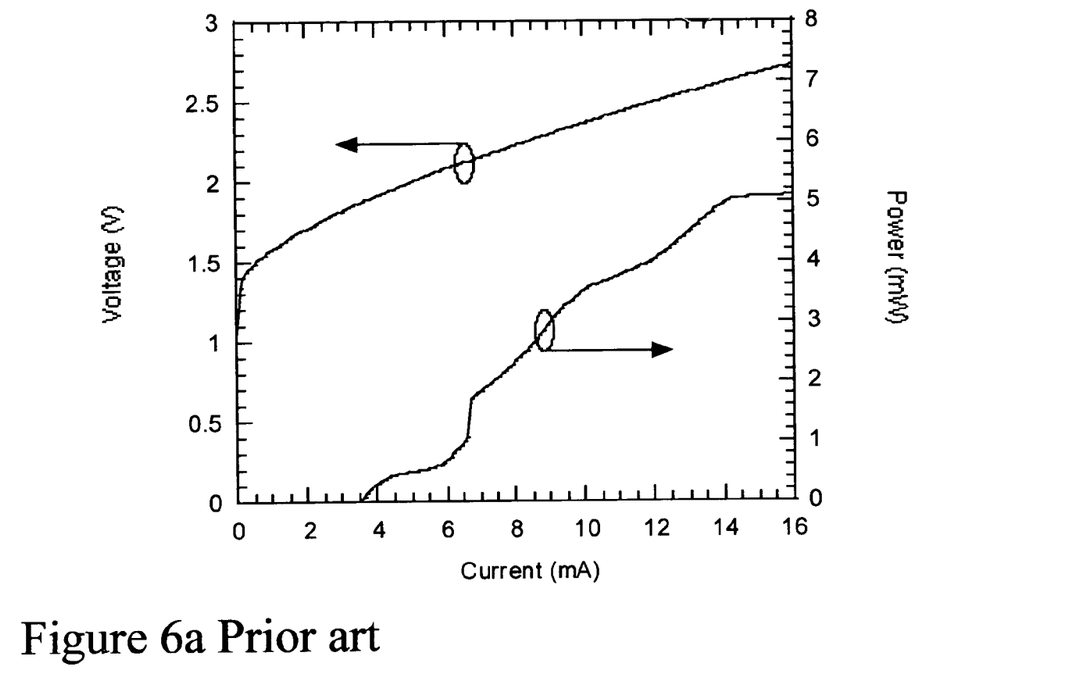
FIGS. 6A–B compare the LI curves of the prior art and the current invention.
Figure 6B:
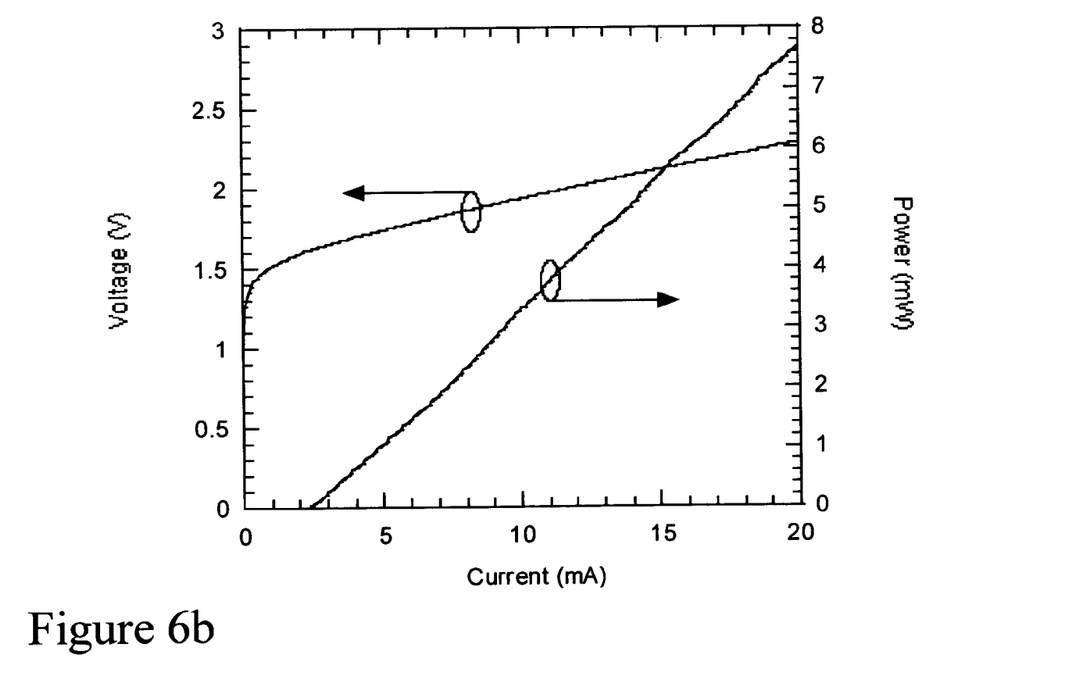

FIGS. 6A–B compare the LI curves of the prior art and the current invention. The LI curve for the prior art implant VCSEL is shown in FIG. 6A shows kinky behavior (discontinuous dL/dI). FIG. 6B shows a VCSEL of the current invention having smooth LI performance leading to cleaner eye diagrams and permitting high speed performance at lower bias currents.

We claim:

1. A vertical cavity surface-emitting laser comprising:
   a device structure, having a height z and an aperture, including
      an active layer having an upper and lower surface, and upper and lower distributed Bragg reflectors on the upper and lower surfaces of the active layer and adjacent thereto;
   a layer having a textured surface within the device structure, positioned at height x, where $0 \leq x < z$;
   contacts for applying a voltage across the active region;
   a light emission property that varies within the aperture, wherein the light emission property enables higher order spatial modes; and
   a refractive index that varies in the plane perpendicular to light output and the light output is in spatially fixed modes.

2. A vertical cavity surface-emitting laser, as defined in claim 1, wherein the refractive index has a lengthscale on the order of the lasing wavelength.

3. A vertical cavity surface-emitting laser, as defined in claim 1, further comprising a substrate having a first side adjacent to the lower distributed Bragg reflector.

4. A vertical cavity surface-emitting laser, as defined in claim 3, wherein the layer having a textured surface further comprises a texturing layer interposed between the substrate and the device structure.

5. A vertical cavity surface-emitting laser, as defined in claim 4, wherein the texturing layer is patterned.

6. A vertical cavity surface-emitting laser, as defined in claim 3, wherein the non-planar layer is a layer within at least one of the upper and lower distributed Bragg reflectors.

7. A vertical cavity surface-emitting laser, as defined in claim 3, wherein the layer within at least one of the upper and lower distributed Bragg reflectors is patterned.

8. A vertical cavity surface-emitting laser, as defined in claim 3, wherein the non-planar layer is a first surface of the substrate adjacent the lower Bragg reflector.

9. A vertical cavity surface-emitting laser, as defined in claim 8, wherein the first surface is patterned.

10. A vertical cavity surface-emitting laser, as defined in claim 3, wherein the non-planar layer introduces a phase mismatch in the device structure.

11. A vertical cavity surface-emitting laser, as defined in claim 10, wherein the non-planar layer is a layer within at least one of the upper and lower distributed Bragg reflectors.

12. A vertical cavity surface-emitting laser, as defined in claim 11, wherein the layer within at least one of the upper and lower distributed Bragg reflectors is patterned.

13. A vertical cavity surface-emitting laser, as defined in claim 3, further comprising a planarizing plane within the device structure, positioned at height y, where $x < y < z$.

14. A vertical cavity surface-emitting laser, as defined in claim 13, between heights x and y, the refractive index varies in the plane perpendicular to the light output.

15. A vertical cavity surface-emitting laser, as defined in claim 13, wherein the refractive index has a lengthscale on the order of the lasing wavelength.

16. A vertical cavity surface-emitting laser, as defined in claim 13, further comprising a substrate having a first surface adjacent to the lower distributed Bragg reflector.

17. A vertical cavity surface-emitting laser, as defined in claim 16, further including a texturing layer interposing the substrate and the device structure, wherein the non-planar layer is the texturing layer.

18. A vertical cavity surface-emitting laser, as defined in claim 17, wherein the texturing layer is patterned.

19. A vertical cavity surface-emitting laser, as defined in claim 17, wherein the non-planar layer is a layer within at least one of the upper and lower distributed Bragg reflectors.

20. A vertical cavity surface-emitting laser, as defined in claim 16, wherein the layer within at least one of the upper and lower distributed Bragg reflectors is patterned.

21. A vertical cavity surface-emitting laser, as defined in claim 16, wherein the non-planar layer is a first surface of the substrate adjacent the lower Bragg reflector.

22. A vertical cavity surface-emitting laser, as defined in claim 21, wherein the first surface is patterned.

23. A vertical cavity surface-emitting laser, as defined in claim 13, wherein the non-planar layer introduces a phase mismatch in the device structure.

24. A vertical cavity surface-emitting laser, as defined in claim 23, wherein the non-planar layer is a layer within at least one of the upper and lower distributed Bragg reflectors.

25. A vertical cavity surface-emitting laser, as defined in claim 23, wherein the layer within at least one of the upper and lower distributed Bragg reflectors is patterned.

26. A method for manufacturing a vertical cavity surface emitting laser comprising the steps of:
   preparing a substrate such that there is a layer having a textured surface having a light emission property that varies within the aperture, wherein the light emission property enables higher order spatial modes;
   depositing a lower distributed Bragg reflector;
   depositing an active layer;
   depositing an upper distributed Bragg reflector; and
   fabricating electrical contacts for applying a voltage across the active layer.

27. A method for manufacturing a vertical cavity surface emitting laser, as defined in claim 26, further comprising the step of removing the substrate after the step of fabricating electrical contacts.

28. A method for manufacturing a vertical cavity surface emitting laser comprising the steps of:
   depositing a lower distributed Bragg reflector having a layer having a textured surface having a light emission property that varies within the aperture, wherein the light emission property enables higher order spatial modes;
   depositing an active layer;
   depositing an upper distributed Bragg reflector; and
   fabricating electrical contacts for applying a voltage across the active layer.

29. A method for manufacturing a vertical cavity surface emitting layer comprising the steps of:
   depositing a lower distributed Bragg reflector;
   depositing an active layer having a layer having a textured surface having a light emission property that varies within the aperture, wherein the light emission property enables higher order spatial modes;
   depositing an upper distributed Bragg reflector; and
   fabricating electrical contacts for applying a voltage across the active layer.

30. A method for manufacturing a vertical cavity surface emitting layer comprising the steps of:
   depositing a lower distributed Bragg reflector;
   depositing an active layer;
   depositing an upper distributed Bragg reflector having a layer having a textured surface having a light emission property that varies within the aperture, wherein the light emission property enables higher order spatial modes; and
   fabricating electrical contacts for applying a voltage across the active layer.

* * * * *